United States Patent [19]
Tounai

[11] Patent Number: 5,357,312
[45] Date of Patent: Oct. 18, 1994

[54] ILLUMINATING SYSTEM IN EXPOSURE APPARATUS FOR PHOTOLITHOGRAPHY

[75] Inventor: Keiichiro Tounai, Tokyo, Japan

[73] Assignee: NEC Corporation, Tokyo, Japan

[21] Appl. No.: 128,002

[22] Filed: Sep. 28, 1993

[30] Foreign Application Priority Data

Oct. 1, 1992 [JP] Japan ................... 4-263451

[51] Int. Cl.$^5$ ............. G03B 27/54; G03B 27/42
[52] U.S. Cl. ............................. 355/67; 355/53; 355/71
[58] Field of Search ............... 355/53, 67, 71; 362/268

[56] References Cited

U.S. PATENT DOCUMENTS

| 5,237,367 | 8/1993 | Kudo | 355/67 |
| 5,245,384 | 9/1993 | Mori | 355/67 |
| 5,287,142 | 2/1994 | Kamon | 355/53 |
| 5,309,198 | 5/1994 | Nakagawa | 355/67 |

FOREIGN PATENT DOCUMENTS 1-216361  8/1989  Japan .

Primary Examiner—Richard A. Wintercorn
Attorney, Agent, or Firm—Young & Thompson

[57] ABSTRACT

The invention relates to an illuminating system in an exposure apparatus used for the fabrication of semiconductor devices to transfer a pattern on a reticle to a substrate having a photosensitive surface. As is usual, the illuminating system has reflecting and collimating elements to form light rays emitted from a light source into a light beam circular in cross-sectional shape, an optical integrater to uniformalize the light beam and an aperture diaphragm to desirably shape the uniformalized light beam. A reducing or magnifying lens, which is interchangeable with another reducing or magnifying lens different in reducing or magnifying power, is added in oreder to vary the diameter of the light beam nearly in conformance with the aperture diameter before the beam arrives at the aperture diaphragm to thereby reduce a loss of illuminating light by blockage by the aperture diaphragm. According to the need, the cross-sectional shape of the light beam can be rendered annular by incorporating a combination of two oppositely aligned optical elements one of which has a conically convex surface on the exit side and the other a conically concave surface opposite to the conically convex surface.

6 Claims, 3 Drawing Sheets

ILLUMINATING SYSTEM IN EXPOSURE APPARATUS FOR PHOTOLITHOGRAPHY

BACKGROUND OF THE INVENTION

This invention relates to an illuminating system in an exposure apparatus which is used in the fabrication of semiconductor devices to transfer a pattern on a reticle to a substrate having a photoresist layer.

In a conventional illuminating system of an exposure apparatus for the aforementioned purpose, light rays emitted from a light source such as a high-pressure mercury lamp are collected by reflection from an ellipsoidally concave mirror. The reflected and collected rays are passed through a series of lenses including a collimator lens to provide parallel rays which proceed toward a reticle and forms a light beam having a circular cross-sectional shape. This light beam is passed through an optical integrator to uniformalize distribution of light rays over the circular cross-sectional area. The light beam emerged from the integrator serves as a secondary light source which is a plane light source having a circular shape. Then the secondary light source is desirably shaped by an aperture diaphragm, and the shaped beam illuminates the reticle through a condenser lens.

Usually the aforementioned aperture diaphragm has a circular aperture. The degree of coherence of the illuminating light impinging on the reticle is variable with a coherence factor $\sigma$ which is determined by the diameter of the aperture, and the resolving power and focus depth of the exposure apparatus depend on the coherence factor $\sigma$. An optimum value of the degree of coherence is variable according to the shape and size of the pattern on the reticle: for fine patterns, an optimum value of the coherence factor $\sigma$ ranges from about 0.5 to about 0.7.

With the purpose of improving the resolving power and focus depth of the exposure apparatus, recently studies have been made on the provision of a phase shifter on a transmissive pattern on the reticle to change the phase of the transmitted light. In this case it is favorable to reduce the coherence factor $\sigma$ to about 0.3 or smaller by narrowing the diameter of the aforementioned aperture for improvements in the resolving power and focus depth.

In the cases of some specific reticle patterns, there is a possibility of improving the resolving power and focus depth of the exposure apparatus by using an annular aperture to shape the secondary light source for illuminating the reticle. The degree of coherence of the illuminating light beam having an annular cross-sectional shape is determined by two coherence factors $\sigma$ and $\sigma'$ which are determined by the outer and inner diameters of the beam, respectively, and it has been revealed that an optimum value of $\sigma$ is about 0.7 while $\sigma'$ is about 70% of $\sigma$.

Thus, the best shape and size of the secondary light source (as a plane light source) for illuminating the reticle are variable according to the type of the reticle and the shape and size of the reticle pattern. In the conventional exposure apparatus, the shape and/or size of the secondary light source are varied by using a plurality of aperture diaphragms which are interchangeable and different in aperture shape and/or size. However, irresepective of the aperture shape there is a problem that a considerable portion of the circular light falling on the aperture diaphragm is blocked by the opaque peripheral area of the diaphragm. That is, a considerable loss of illuminating light accompanies the shaping of illuminating light with an aperture diaphragm. Therefore, the illuminance on the reticle becomes relatively low particularly when the aperture diaphragm is relatively large in the opaque area, and consequently the throughput of the exposure apparatus lowers.

SUMMARY OF THE INVENTION

It is an object of the present invention to provide an improved illuminating system in an exposure apparatus for use in the fabrication of semiconductor devices to transfer a pattern on a reticle to a substrate having a photosensitive surface, the improved illuminating system being capable of greatly reducing a loss of illuminating light in variously shaping a beam of illuminating light by using interchangeable aperture diaphragms.

An illuminating system according to the invention comprises a light source, first optical means for forming light rays emitted from the light source into a light beam having a circular cross-sectional shape, second optical means for uniformalizing the light beam, an aperture diaphragm which has a light beam shaping aperture and is positioned between the second optical means and the reticle and third optical means for variously reducing or magnifying the diameter of the light beam emerged from the first optical means.

In this illuminating system the first and second optical means are conventional means. The invention resides in the addition of the third optical means, which serves the purpose of adjusting the diameter of the light beam used as a secondary light source nearly in conformance with the diameter of the beam shaping aperture. Therefore, only a very small portion of the light beam is blocked by the opaque peripheral region of the aperture diaphragm irrespective of the aperture diameter. In other words, desired shaping of the secondary light source is accomplished with a great reduction in a loss of illuminating light, and accordingly the exposure apparatus does not suffer from lowering of illuminance on the reticle and consequential lowering of throughput.

In a preferred embodiment of the invention, the above described third optical means comprises a plurality of interchangeable reducing or magnifying lenses which are different from each other in reducing or magnifying power. According to the employed aperture diaphragm, selected one of these reducing or magnifying lenses is brought into position between and optically in alignment with the first and second optical means.

Alternative to a plurality of interchangeable lenses, it is possible to use a zoom lens or a few interchangeable zoom lenses.

When it is intended to use a light beam having an annular cross-sectional area as a secondary light source, an illuminating system according to the invention incorporates another optical means for transforming the light beam having a circular cross-sectional shape into a light beam having an annular cross-sectional shape before the light beam is incident on the above described reducing or magnifying lens. An embodiment of the supplemental optical means is a combination of two oppositely aligned transparent optical elements one of which has a conically convex surface as an exit surface and the other a conically concave surface as an entrance surface opposite to the conically convex surface.

DESCRIPTION OF THE PREFERRED EMBODIMENTS

Figure 1:
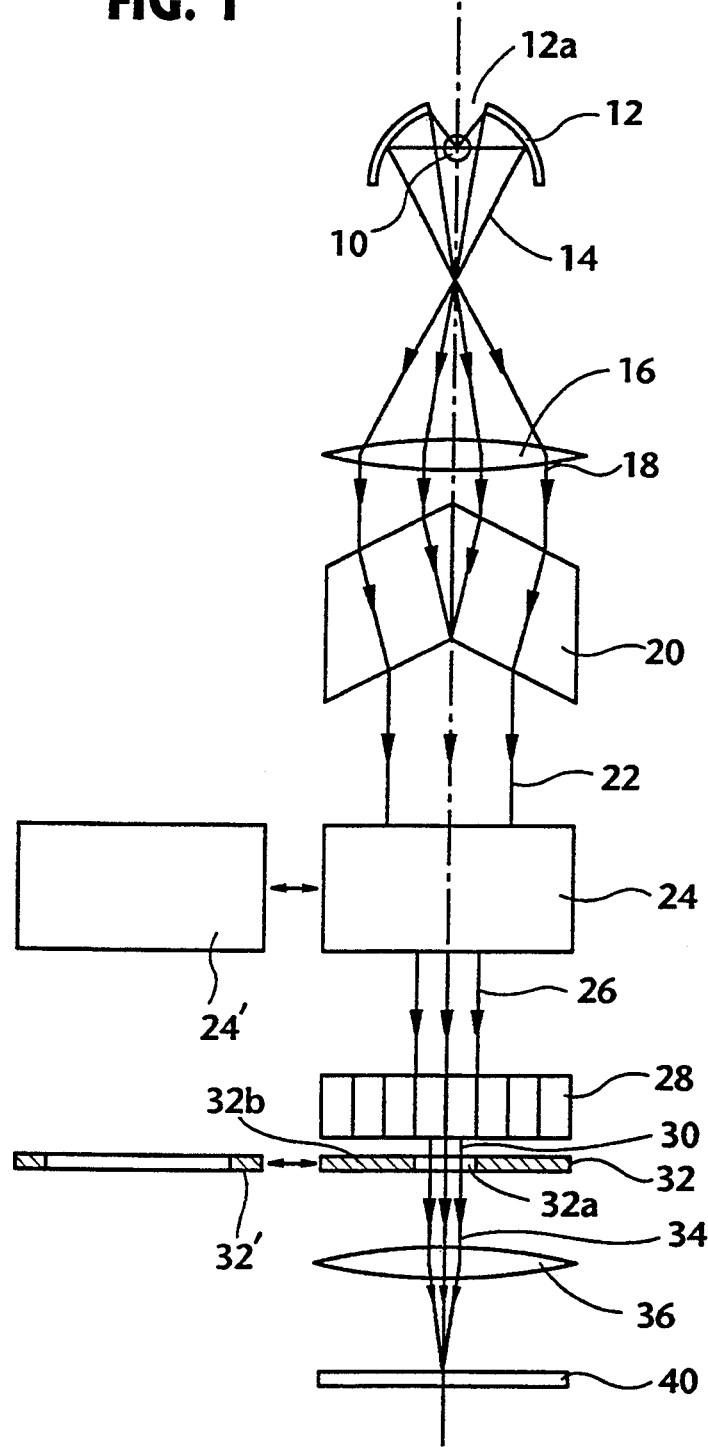
FIG. 1 is a schematic of the fundamental construction of an illuminating system according to the invention and optical paths in the system.

FIG. 1 shows an illuminating system which is an embodiment of the invention. The illuminating system is for illuminating a reticle 40 placed in an exposure apparatus to project an image of a reticle pattern on a substrate (not shown) which is placed below the reticle 40 and has a photosensitive surface.

In this illuminating system a high-pressure mercury lamp 10 is employed as a light source, and there is an ellipsoidally concave mirror 12 to reflect and collect light rays 14 emitted from the lamp 10. The illuminating system has a collimator lens 16 through which the light rays 14 become a bundle of parallel rays 18. The ellipsoidal mirror 10 is incomplete and has a circular opening 12a in a central area, so that the bundle of parallel rays 18 is annular in cross-sectional shape. Therefore, the rays 18 are refracted by a cone lens 20 so as to emerge from the cone lens 20 as a bundle of parallel rays 22 circular in cross-sectional shape. The bundle of parallel rays 22, which may be called a light beam, is directed toward the reticle 40.

According to the invention a reducing lens 24 is positioned below and in alignment with the cone lens 20. By passing through the reducing lens 24 the light beam 22 is constricted into a light beam 26 which is circular in cross-sectional shape with a diameter smaller than the incident light beam 22. The illuminating system includes another reducing lens (or a magnifying lens) 24' which is different in reducing power (or magnifying power) from the reducing lens 24 and interchangeable with the lens 24. The reducing or magnifying lens 24' may be one of a plurality of reducing and/or magnifying lenses which are different in reducing or magnifying power and interchangeable with the reducing lens 24.

Next to the reducing lens 24 there is an optical integrator 28 which uniformalizes the distribution of luminous flux in the light beam 26. So, a uniformalized light beam 30 emerges from the optical integrator 28. This light beam 30 is circular in cross-sectional shape and serves as a plane light source, which is a secondary light source in the illuminating system. It is possible to use a fly-eye lens in place of the optical integrator 28.

Below the optical integrator 28 there is an aperture diaphragm 32 having a circular aperture 32a of a desired diameter in order to desirably define the diameter of the light beam (secondary light source) 30. That is, a shaped light beam 34 which passes through the aperture 32a serves as an accurately desirably shaped secondary light source. Through a condenser lens 36, the light beam 34 illuminates the reticle 40.

A practical illuminating system according to the invention includes conventional subsidiary components such as wavelength selection filters, beam splitter, illuminometer, field stop for the rectile, etc.

Figure 3:
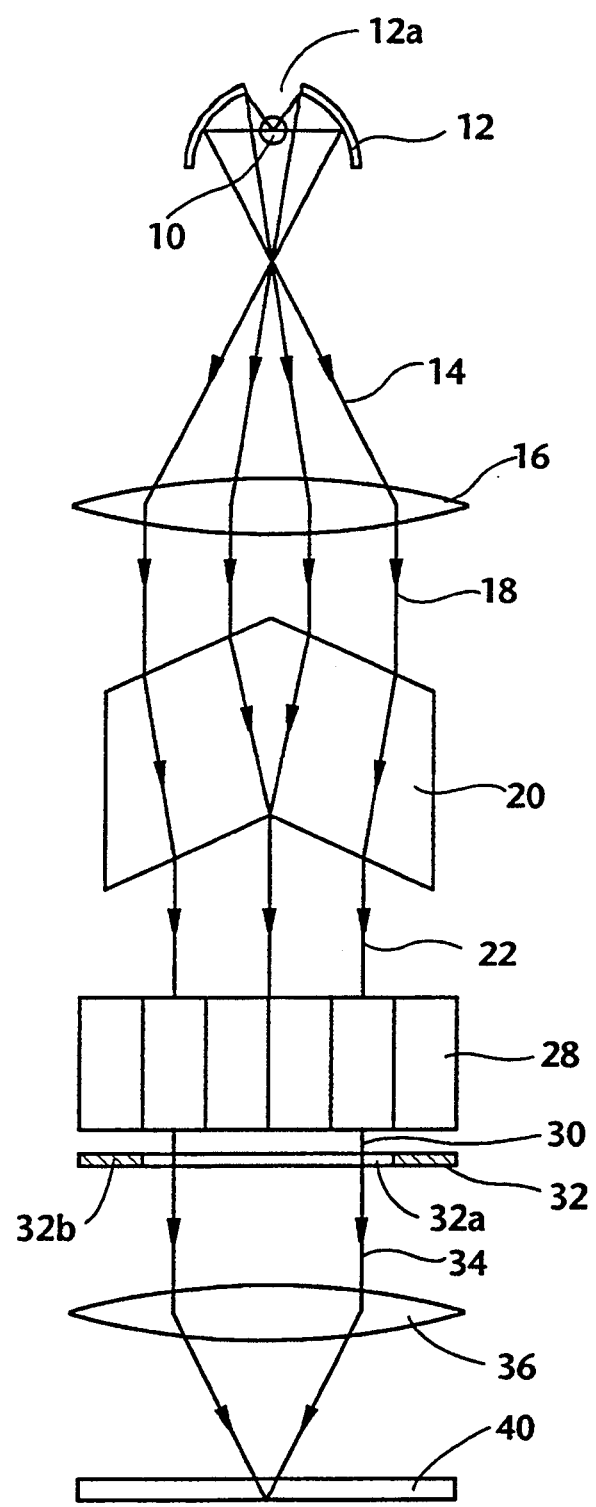
FIG. 3 is a schematic of the fundamental construction of a conventional illuminating system and optical paths in the system.

For comparison, FIG. 3 shows a conventional illuminating system which is the basis of the illumination system of FIG. 1.

The conventional illuminating system of FIG. 3 has a high-pressure mercury lamp 10, a collimator lens 16, a cone lens 20, an optical integrator 28, an aperture diaphragm 32 and a condenser lens 36 all of which are substantially identical with the counterparts in the illuminating system of FIG. 1. However, in the system of FIG. 3 there is no lens between the cone lens 20 and the optical integrator 28. Therefore, right above the aperture diaphragm 32 in FIG. 3 the uniformalized light beam 30, which serves as secondary light source, has a considerably large diameter by comparison with the diameter of the shaping aperture 32a. As the light beam 30 is shaped by the aperture 32a into a light beam 34 of a smaller diameter, a considerable portion of the light beam 30 is blocked by the opaque peripheral region 32b of the aperture diaphragm 32, which means a considerable loss of illuminating light.

In the illuminating system of FIG. 1, the reducing power of the reducing lens 24 is selected such that the diameter of the light beam 26 emerging from the lens 24 is only slightly larger than the diameter of the shaping aperture 32a. Therefore, only a very small amount of the light beam or secondary light source 30 is blocked by the opaque peripheral region 32b of the aperture diaphragm, so that a loss of illuminating light is greatly reduced. When the diameter of the light beam 22 is relatively small by comparison with the diameter of the shaping aperture 32b, the reducing lens 24 in FIG. 1 is replaced by a magnifying lens.

The aperture diaphragm 32 is interchangeable with another aperture diaphragm 32' different in aperture diameter. The aperture diaphragm 32' may be one of a plurality of aperture diaphragms all of which are different in aperture diameter and interchangeable with the aperture diaphragm 32. The reducing and/or magnifying lenses 24, 24', etc. are interchanged according to the aperture diameter of the employed aperture diaphragm 32.

Alternative to the interchangeable reducing and/or magnifying lenses 24, 24', etc. in FIG. 1, it is possible to use a zoom lens, i.e. a compound lens in which the distance between two lenses is variable, or a few zoom lenses which are interchangeable.

Figure 2:
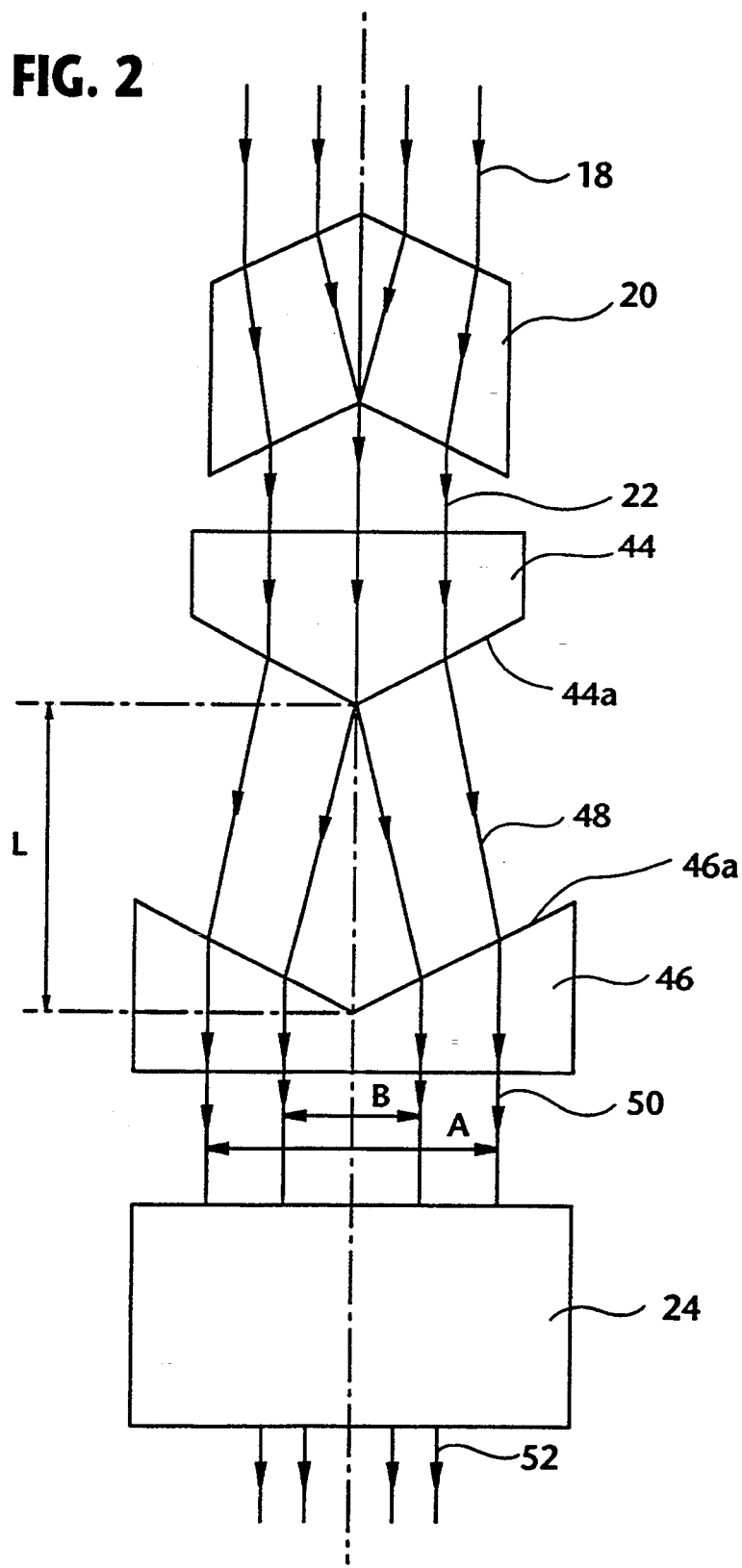
FIG. 2 is a schematic of a partial modification of the illuminating system of FIG. 1.

FIG. 2 shows a principal part of another embodiment of the invention. In this embodiment, a combination of two transparent optical elements 44 and 46 is added to the illuminating system of FIG. 1. The two optical elements 44, 46 are positionend between and in alignment with the cone lens 20 and the reducing or magnifying lens 24. The optical element 44, which is next to the cone lens 20, has a conically convex surface 44a on the exit side. The optical element 46, which is nearer to the reducing or magnifying lens 24, has a conically concave surface 46a on the entrance side. That is, the conically concave surface 46a is opposite to the conically convex surface 44a of the optical element 44. The distance L between these two optical elements 44 and 46 is variable.

In the illuminating system of FIG. 2, a bundle of parallel light rays 22 emerges from the cone lens 20 as described with reference to the illuminating system of FIG. 1. The parallel rays 22 are incident on the front plane surface of the optical element 44, and diverging light rays 48 emerge from the conical surface 44a of the element 44. The diverging rays 48 are incident on the conically concave surface 46a of the optical element 46, and a bundle of parallel light rays 50, viz. a light beam, emerges from the plane bottom surface of the element 46. This light beam 50 is annular in cross-sectional shape. Thus, the combination of the two optical elements 44 and 46 is used to transform the light beam 22 having a circular cross-sectional shape into the light beam 50 having an annular cross-sectional shape. The ratio of the inner diameter B of the annular beam 50 to the outer diameter A can be varied by varying the distance L between the two optical elements 44 and 46. The ratio of B to A becomes greater as the distance L is made longer. When the distance L is zero, the cross-sectional shape of the light beam 50 becomes circular.

The light beam 50 serves as a plane light source of an annular shape. The outer and inner diameters of the annular light source 50 are suitably reduced (or magnified) by the reducing (or magnifying) lens 24, which is interchangeable with another reducing or magnifying lens as described with respect to the illuminating system of FIG. 1. After that the annular light source 52 of reduced diameter is accurately shaped by an aperture diaphragm (not shown in FIG. 2). Also in this embodiment, the reducing lens 24 serves the purpose of minimizing a loss of illuminating light in shaping the light beam with the aperture diaphragm.

What is claimed is:

1. An illuminating system in an exposure apparatus for transferring a pattern on a reticle to a substrate having a photosensitive surface, the illuminating system comprising:

a light source;

first optical means for forming light rays emitted from the light source into a light beam having a circular cross-sectional shape;

second optical means for uniformalizing said light beam;

an aperture diaphragm which has a light beam shaping aperture and is positioned between said second optical means and the reticle; and third optical means for variously reducing or magnifying the diameter of the light beam emerged from said first optical means.

2. An illuminating system according to claim 1, wherein said third optical means comprises a plurality of reducing or magnifying lenses which are different from each other in reducing or magnifying power, one of said reducing or magnifying lenses being interchangeably positioned between and optically in alignment with said first optical means and said second optical means.

3. An illuminating system according to claim 1, wherein said third optical means comprises a reducing or magnifying lens which is a compound lens in which the distance between two lenses is variable to vary the reducing or magnifying power.

4. An illuminating system according to claim 1, further comprising fourth optical means for transforming said light beam having a circular cross-sectional shape into a light beam having an annular cross-sectional shape before the light beam arrives at said third optical means.

5. An illuminating system according to claim 4, wherein said third optical means comprises a combination of first and second transparent optical elements positioned between and optically in alignment with said first optical means and said third optical means, the first optical element nearler to said first optical means having a conically convex surface as an exit surface, the second optical element having a conically concave surface as an entrance surface facing the conically convex surface of the first optical element.

6. An illuminating system according to claim 5, wherein the distance between said first and second optical elements is variable to vary the ratio of the inner diameter of the light beam having an annular cross-sectionlal shape to the outer diameter.

* * * * *